United States Patent [19]
Hunter

[11] Patent Number: 6,066,205
[45] Date of Patent: May 23, 2000

[54] GROWTH OF BULK SINGLE CRYSTALS OF ALUMINUM NITRIDE FROM A MELT

[75] Inventor: Charles Eric Hunter, Hilton Head Island, S.C.

[73] Assignee: Cree, Inc., Durham, N.C.

[21] Appl. No.: 09/361,944

[22] Filed: Jul. 27, 1999

Related U.S. Application Data

[62] Division of application No. 08/944,393, Oct. 6, 1997, Pat. No. 5,954,874.
[60] Provisional application No. 60/028,952, Oct. 17, 1996.
[51] Int. Cl.[7] .................................................. C30B 35/00
[52] U.S. Cl. ......................... 117/200; 117/201; 117/202; 117/950; 117/952
[58] Field of Search ................................... 117/200, 201, 117/202, 950, 952

[56] References Cited

U.S. PATENT DOCUMENTS 5,858,086  1/1999  Hunter ........................................ 117/84
5,972,109  10/1999  Hunter ...................................... 117/204

*Primary Examiner*—Felisa Hiteshew
*Attorney, Agent, or Firm*—Richard S. Faust

[57]  ABSTRACT

Large diameter single crystals of aluminum nitride (AlN) are grown isotropically by injecting a nitrogen-containing gas into liquid aluminum at elevated temperatures. A seed crystal that is maintained at a temperature below that of the surrounding liquid aluminum is pulled from the melt, while the AlN that is formed in the melt is deposited on the seed crystal. An apparatus for carrying out the method is also disclosed.

13 Claims, 2 Drawing Sheets

$Al_{liq} + 1/2\, N_{2gas} \rightarrow AlN_{solid}$

GROWTH OF BULK SINGLE CRYSTALS OF ALUMINUM NITRIDE FROM A MELT

CROSS REFERENCE TO RELATED APPLICATION

This is a division of application Ser. No. 08/944,393, filed Oct. 6, 1997, now U.S. Pat. No. 5,954,874, which claims priority based on provisional application Serial No. 60/028,952 filed Oct. 17, 1996.

FIELD OF THE INVENTION

The invention relates to the growth of semiconductor materials. More particularly, the invention relates to the growth of bulk single crystals of aluminum nitride.

BACKGROUND OF THE INVENTION

The physical and electronic properties of aluminum nitride (AlN) give it a real potential for a wide variety of semiconductor applications. AlN has a wide energy bandgap (6.2 electron volts), high breakdown electric field and extremely high thermal conductivity. In fact, in Chow et al. *Wide Bandgap Compound Semiconductors for Superior High Voltage Unipolar Power Devices* (IEEE Transactions on Electron Devices, Vol. 41, No. 8, 1994) ranking of all semiconductor materials, AlN is reported to have, excluding diamond, the highest figure of merit for unipolar power device performance.

In addition, the high thermal conductivity and high optical transmissivity (i.e., low optical density) of AlN make AlN an excellent candidate substrate material. Also, AlN is likely to be the optimum substrate for the growth of pseudo-binary inter metallic compounds such as $Al_{0.8}In_{0.2}N$ which have extremely high figures of merit for semiconductor performance (up to 4,413,000 times silicon). Although AlN has extraordinary properties for a semiconductor material and has tremendous commercial potential, AlN based semiconductor devices have been limited by the unavailability of large, low defect AlN single crystals. In their successful prior work, Slack and McNelly demonstrated a method for growing AlN single crystals via sublimation in *AlN Single Crystals* (Journal of Crystal Growth 42, 1977). However, the time required to grow a 12 mm by 4 mm crystal was approximately 150 hours. This growth rate is far too low to ever allow the commercial production of AlN single crystals.

In general, pulling a crystal from a molten liquid that is in equilibrium is a preferred growth process because it provides an extremely stable and uniform temperature profile across the growing crystal interface. However, despite the significant potential applications of AlN as a semiconductor material, no process has been successfully developed to pull bulk single crystals of AlN from a melt or solution of AlN that is in equilibrium, primarily because AlN only forms a liquid at extremely high pressures and temperatures and because aluminum has a very low solubility for AlN.

SUMMARY OF THE INVENTION

The present invention enables the growth of bulk AlN crystals at commercial production rates, for example, growth rates greater than 0.5 mm per hour. The invention in its most basic form is a method for the isotropic growth of large diameter single crystalline AlN by contacting nitrogen with liquid aluminum (Al) at elevated temperatures to form AlN in the melt, while depositing the AlN so formed on a seed crystal.

One feature of this invention is a unique system for creating AlN in liquid Al at elevated temperatures. In one embodiment, the system injects $N_2$ into the liquid Al which forms AlN that immediately comes out of solution by depositing on a seed crystal that is maintained at a lower temperature than the surrounding liquid Al.

Because the reaction of liquid Al and $N_2$ has negative free energy change below 2563° C., AlN will form in liquid Al according to $Al_{(1)} + \frac{1}{2}N_{2(g)} \rightarrow AlN_{(g)}$. Even though the $N_2$ bond strength is very high (9.8 electron volts), the reaction to form AlN by reacting liquid Al with $N_2$ occurs very rapidly at a pressure of 4 atmospheres and temperatures below 2,400° C.

BRIEF DESCRIPTION OF THE DRAWINGS

Some of the features of the invention having been stated, other features will appear as the description proceeds, when taken in connection with the accompanying drawings, in which.

DETAILED DESCRIPTION OF THE INVENTION

Figure 1:
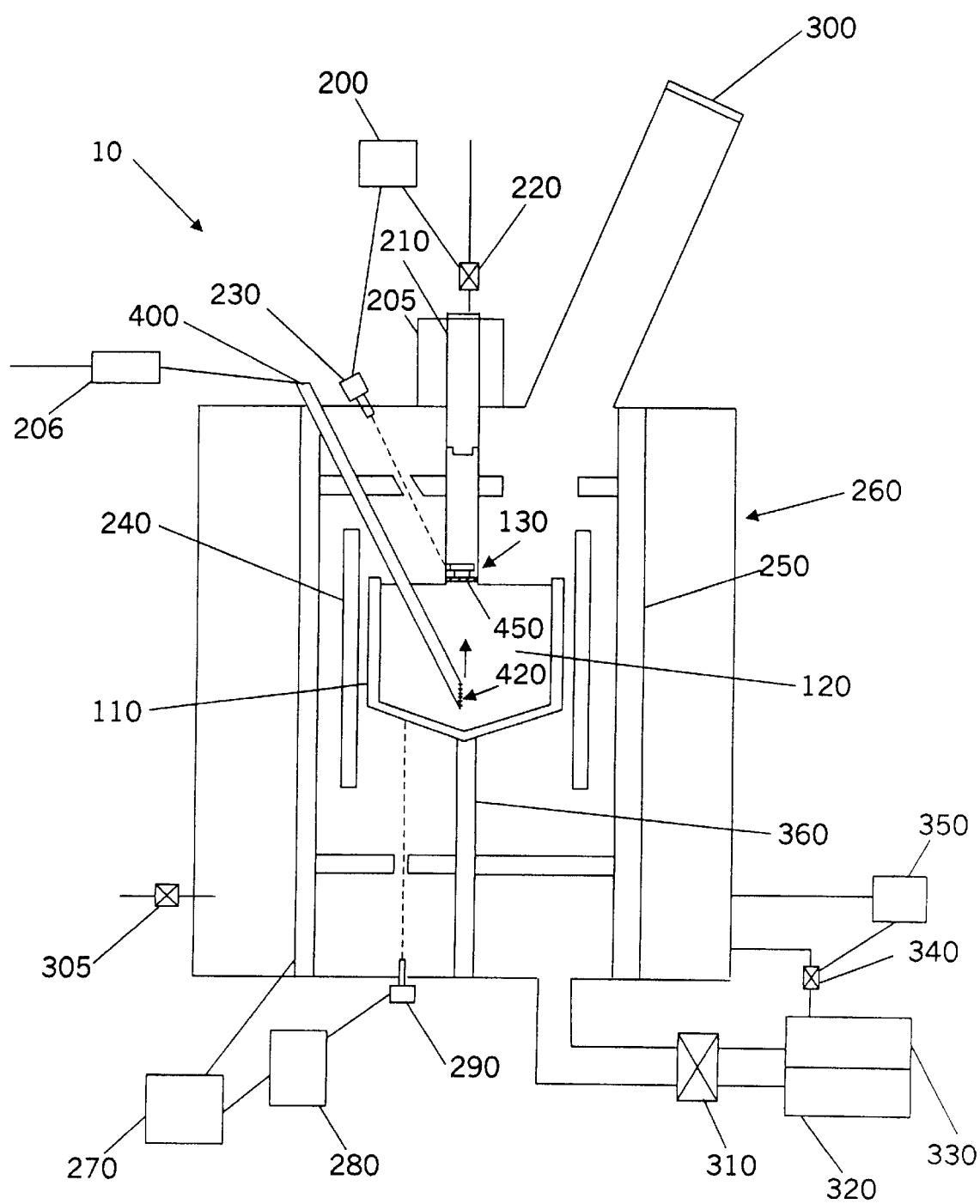
FIG. 1 is a schematic representation of one system for growing bulk single crystals of aluminum nitride in accordance with the invention.

While the present invention will be described more fully hereinafter with reference to the accompanying drawings, in which aspects of the preferred manner of practicing the present invention are shown, it is to be understood at the outset of the description which follows that persons of skill in the appropriate arts may modify the invention herein described while still achieving the favorable results of this invention. Accordingly, the description which follows is to be understood as being a broad, teaching disclosure directed to persons of skill in the appropriate arts, and not as limiting upon the present invention.

In one embodiment of the invention, system 10 shown in FIG. 1, a boron nitride (BN) nitrogen gas injector 400 is utilized to force $N_2$ gas into the bottom of a high density graphite crucible 110 containing liquid Al 120 such that the $N_2$ gas will form AlN and redeposit on a seed crystal 130 that is held at a temperature below the temperature of the liquid Al. The crucible is contained in a 316 stainless steel chamber 260 and is heated by a cylindrical resistant graphite heating element 240. Heat shields 250 as known in the art are utilized.

Figure 2:
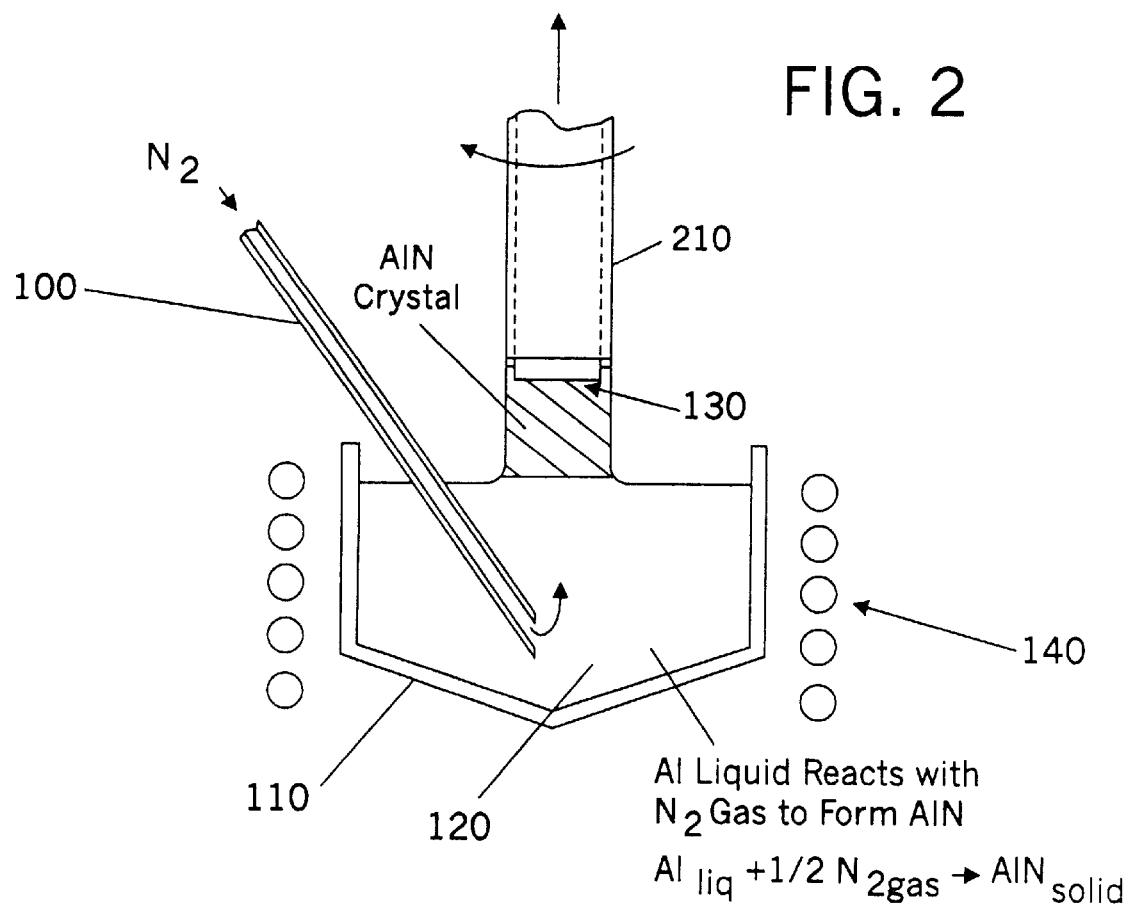
FIG. 2 is a view of a subassembly of a system such as that of FIG. 1, wherein the crucible is heated by an induction heating coil.

In another embodiment of the invention (subassembly 2) shown in FIG. 2, the crucible is heated by an induction heating coil 140.

In other embodiments of the invention, the crucible may be heated by more than one resistance heating element so as to produce a vertical thermal gradient through the crucible containing liquid Al. Multiple heating elements can take the form of cylindrical rings, a flat plate at the bottom of the crucible used in combination with a cylindrical heating element along the side of the crucible, flat plates above and below the crucible or any other combination that allows control of the thermal profile through the crucible.

The crucible can be fabricated from graphite, high density graphite, pyrolytic graphite, silicon carbide coated graphite, Al$_2$O$_3$, zirconium oxide, BN or other suitable material. In addition, a water cooled cold-crucible fabricated from copper may be used when employing induction heating.

The seed temperature can be controlled by controlling the flow of cooling water to the thermal sink 210 (shown most clearly in FIG. 2), with it being understood that seed 130 is in intimate heat transfer relationship with thermal sink 210. The temperature control loop includes an optical pyrometer 230 linked to a thermal sink temperature controller 200 which, in turn, is linked to a cooling water control valve 220.

The N$_2$ gas injector 400 may be fabricated from BN, high density graphite or other suitable material. The gas is preferably injected in the liquid Al directly below the growing crystal interface 450. A gas diffuser 420 located at the end of gas injector 400 containing a plurality of holes may be employed to ensure that large unreacted N$_2$ bubbles do not form in the liquid Al.

The seed is fabricated from single crystalline SiC, Al$_2$O$_3$, W or AlN.

Means for visual observation and control of the system is supplied by a view port 300.

Other elements of system 10 will be described, along with their functions, in the two examples immediately below.

EXAMPLE I

The N$_2$ gas injector 400 is inserted into crucible 110. Al material weighing 850 grams having a purity level greater than 99.999% is loaded into crucible 110. The crucible is placed into chamber 260 and screwed into graphite crucible support rod 360. The chamber is then sealed and pumped down to 10$^{-3}$ torr with mechanical pump 330 in a linear ramp over 10 minutes. Magnetic control valve 340 is utilized to control the pressure down to 10 torr. A three inch diameter throttle valve 310 is utilized to control the pressure below 10 torr. A turbomolecular pump 320 is then used to pump the chamber down to 10$^{-5}$ torr. Next, the chamber is backfilled with high purity N$_2$ using control valve 305 to a pressure of 3,000 torr. Pressure controller 350 is used to maintain the chamber pressure at 3,000 torr during the growth process.

The crucible temperature is then increased to 1470° C. in a linear ramp over one hour using temperature controller 280. The 0.5 inch diameter seed 130 is then lowered into the liquid Al using the vertical pull/rotate mechanism 205, and rotation is set at 1.5 rpm. The N$_2$ flow rate is set at 3.5 standard cubic centimeter per minute into the injector 400 with thermal mass flow controller 206. The seed temperature is set at 1425° C. using temperature controller 280 which is linked to an optical pyrometer 290 and the power supply 270 for heater 240. The seed is then pulled up to create a meniscus 2–3 mm in height at the seed liquid interface. The vertical pull mechanism is then set to raise the seed at 0.5 mm per hour. This pull rate is adjusted every 4 minutes to maintain the meniscus at 2–3 mm in height. When the diameter of the crystal reaches 2 inches the pull rate is increased to 0.8 mm per hour and adjusted every 4 minutes to maintain a meniscus of 3–5 mm and to maintain the crystal diameter at 2 inches. The crystal is pulled in this configuration for 16 hours.

The crystal is then pulled approximately 0.5 cm out of the Al and the power to the heating element is reduced to zero in a linear ramp over 1 hour. The system is allowed to cool for an additional 2 hours and the N$_2$ pressure is reduced to 760 torr via control valve 340.

The resulting AlN single crystal is 11–15 mm in height and 2 inches in diameter.

EXAMPLE II

The N$_2$ gas injector 400 is inserted into crucible 110. Al material weighing 1400 grams having a purity level greater than 99.999% is loaded into crucible 110. The crucible is placed into chamber 260 and screwed into graphite crucible support rod 360. The chamber is then sealed and pumped down to 10$^{-3}$ torr with mechanical pump 330 in a linear ramp over 10 minutes. Magnetic control valve 340 is utilized to control the pressure down to 10 torr. The three inch diameter throttle valve 310 is utilized to control the pressure below 10 torr. The turbomolecular pump 320 is then used to pump the chamber down to 10$^{-5}$ torr. Next, the chamber is backfilled with high purity N$_2$ using control valve 300 to a pressure of 3,000 torr. Pressure controller 350 is used to maintain the chamber pressure at 3,000 torr during the growth process.

The crucible temperature is then increased to 1540° C. in a linear ramp over one hour using temperature controller 280. The 0.5 inch diameter seed is then lowered into the liquid Al using the vertical pull/rotate mechanism 205, and rotation is set at 1.5 rpm. The N$_2$ flow rate is set at 6.5 standard cubic centimeter per minute into the injector 400 with thermal mass flow controller 206. The seed temperature is set at 1495° C. using temperature controller 280 which is linked to an optical pyrometer 290 and the power supply 270 for heater 240. The seed is then pulled up to create a meniscus 2–3 mm in height at the seed liquid interface. The vertical pull mechanism is then set to raise the seed at 0.7 mm per hour. This pull rate is adjusted every 4 minutes to maintain the meniscus at 2–3 mm in height. When the diameter of the crystal reaches 2 inches, the pull rate is increased to 1.6 mm per hour and adjusted every 4 minutes to maintain a meniscus of 3–5 mm and to maintain the crystal diameter at 2 inches. The crystal is pulled in this configuration for 16 hours.

The crystal is then pulled approximately 0.5 cm out of the Al melt and the power to the heating element is reduced to zero in a linear ramp over 1 hour. The system is allowed to cool for an additional 2 hours, and the N$_2$ pressure is reduced to 760 torr via control valve 340.

The resulting AlN single crystal is 25–30 mm in height and 2 inches in diameter.

Other Advantages and Features of the Invention

One important feature of the present invention is that it is particularly well suited for growth of crystals greater than 1 inch in diameter and having a length greater than 5 mm, for example, a length on the order of 5–100 mm. As discussed above, such large crystals are desirable, if not necessary, for many applications.

Another feature of the invention is that in preferred embodiments it employs a gas reaction, which permits the system designer to utilize a wide range of molten Al temperatures. At lower temperatures, e.g. a temperature on the order of 800° C., the system designer has a relatively wide latitude with respect to crucible materials that will not materially contaminate the Al melt due to the relatively lower solubility of crucible materials at lower temperatures. At 800° C., for example, a graphite crucible may be used with very low Al melt contamination by carbon from the graphite. On the other hand, with the use of appropriate crucible materials as discussed above, the system may operate at higher molten Al temperatures, up to approximately 2200° C. for example, to obtain higher AlN crystal growth rates.

Also in connection with the molten Al temperatures, it will be appreciated that it is relatively easy to control the temperature of a melt as compared to controlling temperatures throughout a sublimation growth system, thus making for more reliably consistent growth conditions at the crystal growth interface.

Another feature of the invention is that it may be carried out utilizing inexpensive raw materials, i.e. Al and $N_2$ gas, both of which are commercially available at low cost in sufficiently pure form.

Figure 3:
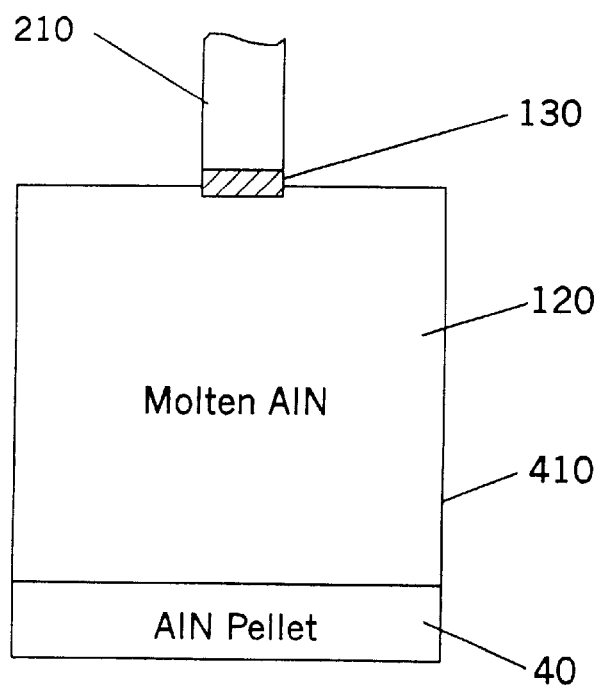
FIG. 3 is a view of an alternative embodiment wherein the nitrogen is supplied to the Al melt in solid form.

It will be appreciated that the embodiment of FIGS. 1 and 2, and the processes described above, may be varied in numerous ways without departing from the true spirit and scope of the invention. For example, instead of injecting a nitrogen-containing gas into the melt, the nitrogen-containing gas may be provided at the surface of the melt where AlN can form, go into solution and then be deposited on the crystal growth surface. Also, as another alternative, nitrogen may be supplied to the melt in a solid nitrogen-containing compound. One manner of providing nitrogen in solid form is shown in FIG. 3 wherein an AlN pellet 400, for example a pellet formed of isostatically pressed AlN powder, is maintained at the bottom of a crucible 410, with the molten Al positioned above the AlN pellet and the seed crystal at the top of the melt. A temperature gradient is maintained with the highest temperature at the solid AlN and the lowest temperature at the crystal.

As yet another alternative embodiment, the single crystalline AlN may be deposited without pulling the seed crystal. While pulling the crystal has the advantages mentioned earlier in this specification, suitable growth may be achieved on the seed crystal without pulling provided the crystal growth surface is properly cooled.

As mentioned briefly above, one alternative to resistance heating is utilization of a cold crucible in conjunction with a form of induction heating. In this application, the crucible may be made of copper with slits that prevent the crucible from suscepting. Microwave or radio frequency (RF) energy is used at desired frequency to heat the melt. One advantage of this cold crucible approach is that the crucible material does not tend to contaminate the melt because a very thin outer portion of the molten Al will tend to solidify, thereby forming a barrier to contamination. Additionally, the microwave or RF energy may be chosen to selectively excite, and therefore heat, the molecules of the melt while not materially heating the crucible.

Another alternative embodiment of the crucible includes a nitrogen-containing substance as part of the crucible, for example, a crucible made of BN.

Another alternative feature of the invention is the provision of a microwave, RF or laser to excite or partially ionize the nitrogen-containing gas that is brought into contact with the melt. Such a system may be used in conjunction with gas injector 400 of FIG. 1.

Lastly, instead of using a pure Al melt, an Al-containing compound such as aluminum chloride may be used alone or in conjunction with pure Al to form the melt. As used herein, the terms "Al melt", "liquid Al", "melt of liquid Al", and the like, are intended to encompass both a pure Al melt and this alternative manner of carrying out the invention.

While a pressure of 3000 torr has been disclosed in the examples above as a suitable chamber pressure during the crystal growth operation, other pressures may be used, with it being understood that a pressure substantially above the vapor pressure of aluminum at the given growth temperature is necessary under the growth conditions discussed above. In this regard, it should be understood that techniques such as known gas encapsulation techniques may be utilized to suppress vaporization of the Al, thus allowing relatively high growth temperatures at a given pressure.

That which is claimed is:

1. An apparatus for the growth of bulk single crystals of AlN by depositing AlN formed in a liquid Al melt on the crystal growth surface of a seed crystal, said apparatus comprising:

a crucible holding a melt of liquid Al;

a heater for maintaining the temperature of the melt;

means for contacting nitrogen with the melt and causing AlN to form in the melt;

a seed crystal having a crystal growth surface in physical contact with the melt; and a thermal sink for maintaining the growth surface of the crystal at a sufficiently low temperature to create a sufficient thermal gradient to cause AlN in the melt to deposit on the growth surface.

2. The apparatus of claim 1 wherein said means for contacting nitrogen with the melt comprises a gas injector for injecting a nitrogen-containing gas into the melt.

3. The apparatus of claim 2 including means for exciting or partially ionizing the nitrogen-containing gas.

4. The apparatus of claim 2 including a pulling mechanism for pulling the seed crystal as it grows at a rate greater than about 0.5 mm per hour.

5. The apparatus of claim 4 wherein the melt is substantially pure Al.

6. The apparatus of claim 5 wherein the nitrogen-containing gas is predominantly $N_2$.

7. The apparatus of claim 6 including a chamber containing the crucible and further including means for maintaining a pressure in the chamber up to about 3000 torr.

8. The apparatus of claim 1 wherein said means for contacting nitrogen with the melt comprises a solid nitrogen-containing substance in contact with the melt.

9. The apparatus of claim 1 including a pulling mechanism for raising the crystal as it grows to maintain the growing crystal surface in substantially the same position throughout the growth cycle.

10. The apparatus of claim 1 wherein said crucible is formed from a material selected from the group consisting of: graphite, high density graphite, pyrolytic graphite, silicon carbide coated graphite, $Al_2O_3$, zirconium oxide and BN.

11. The apparatus of claim 1 wherein the melt is substantially pure Al.

12. The apparatus of claim 1 wherein the melt comprises an aluminum-containing compound.

13. The apparatus of claim 1 including a pulling mechanism for pulling the seed crystal as it grows at a rate greater than about 0.5 mm per hour.

* * * * *